United States Patent
Donghi et al.

(10) Patent No.: US 10,084,016 B2
(45) Date of Patent: Sep. 25, 2018

(54) CROSS-POINT MEMORY AND METHODS FOR FABRICATION OF SAME

(71) Applicant: MICRON TECHNOLOGY, INC., Boise, ID (US)

(72) Inventors: Ombretta Donghi, Lesmo (IT); Marcello Ravasio, Olgiate Molgora (IT); Samuele Sciarrillo, Lomagna (IT); Roberto Somaschini, Vimercate (IT)

(73) Assignee: MICRON TECHNOLOGY, INC., Boise, ID (US)

( * ) Notice: Subject to any disclaimer, the term of this patent is extended or adjusted under 35 U.S.C. 154(b) by 193 days.

(21) Appl. No.: 14/086,460

(22) Filed: Nov. 21, 2013

(65) Prior Publication Data
US 2015/0137061 A1 May 21, 2015

(51) Int. Cl.
*H01L 47/00* (2006.01)
*H01L 27/24* (2006.01)
*H01L 45/00* (2006.01)

(52) U.S. Cl.
CPC ...... *H01L 27/2463* (2013.01); *H01L 27/2427* (2013.01); *H01L 27/2445* (2013.01); *H01L 45/06* (2013.01); *H01L 45/1233* (2013.01); *H01L 45/144* (2013.01); *H01L 45/1675* (2013.01)

(58) Field of Classification Search
CPC ... H01L 45/06; H01L 45/141; H01L 45/1233; H01L 27/2427; H01L 27/2445; H01L 27/2463; H01L 45/1675
See application file for complete search history.

(56) References Cited

U.S. PATENT DOCUMENTS

| | | | |
|---|---|---|---|
| 8,143,610 B2 | 3/2012 | Park et al. | |
| 8,153,527 B2 | 4/2012 | Loh et al. | |
| 2005/0054122 A1* | 3/2005 | Celii | H01L 21/31122 438/3 |
| 2005/0127350 A1* | 6/2005 | Furkay | H01L 45/06 257/4 |

(Continued)

OTHER PUBLICATIONS

Campbell et al., U.S. Appl. No. 14/244,486 entitled, *Semiconductor Structures Including Multi-Portion Liners and Related Methods*, filed Apr. 3, 2014.

(Continued)

*Primary Examiner* — Frederick B Hargrove
(74) *Attorney, Agent, or Firm* — Holland & Hart LLP

(57) ABSTRACT

A method of fabricating a memory device is disclosed. In one aspect, the method comprises patterning a first conductive line extending in a first direction. The method additionally includes forming a free-standing pillar of a memory cell stack on the first conductive line after patterning the first conductive line. Forming the free-standing pillar includes depositing a memory cell stack comprising a selector material and a storage material over the conductive line and patterning the memory cell stack to form the free-standing pillar. The method further includes patterning a second conductive line on the pillar after patterning the memory cell stack, the second conductive line extending in a second direction crossing the first direction.

13 Claims, 12 Drawing Sheets

(56) References Cited

U.S. PATENT DOCUMENTS

| | | | |
|---|---|---|---|
| 2006/0097240 A1* | 5/2006 | Lowrey | G11C 13/0004 257/5 |
| 2006/0249850 A1* | 11/2006 | Erturk | H01L 23/5225 257/775 |
| 2008/0293207 A1 | 11/2008 | Koutny, Jr. | |
| 2010/0012912 A1* | 1/2010 | Schricker | H01L 27/101 257/2 |
| 2010/0044664 A1* | 2/2010 | Liu | H01L 27/2463 257/2 |
| 2010/0163818 A1* | 7/2010 | Lee | H01L 27/2427 257/2 |
| 2012/0001145 A1 | 1/2012 | Magistretti et al. | |
| 2012/0068136 A1* | 3/2012 | Park | H01L 45/06 257/1 |
| 2012/0117801 A1* | 5/2012 | Kim | H01L 45/04 29/846 |
| 2012/0220099 A1 | 8/2012 | Dennison | |
| 2012/0224413 A1* | 9/2012 | Zhang | B82Y 10/00 365/148 |
| 2012/0225534 A1* | 9/2012 | Lee | H01L 45/1675 438/382 |
| 2012/0235109 A1 | 9/2012 | Nojiri | |
| 2012/0286227 A1* | 11/2012 | Chung | H01L 27/2463 257/4 |
| 2013/0043455 A1 | 2/2013 | Bateman | |
| 2013/0056698 A1* | 3/2013 | Satoh | H01L 27/101 257/2 |
| 2013/0082231 A1* | 4/2013 | Tada | G11C 13/0007 257/4 |
| 2013/0137275 A1 | 5/2013 | Tong et al. | |
| 2013/0207068 A1 | 8/2013 | Pellizzer | |
| 2013/0320290 A1* | 12/2013 | Park | H01L 45/1286 257/4 |
| 2013/0333835 A1 | 12/2013 | Carcia | |

OTHER PUBLICATIONS

Dameron et al., "Molecular Layer Deposition of Alucone Polymer Films Using Trimethylaluminum and Ethylene Glycol," *Chemical Materials*, vol. 20, pp. 3315-3326 (2008).

Jen et al., "Critical tensile strain and water vapor transmission rate for nanolaminate films grown using $Al_2O_3$ atomic layer deposition and alucone molecular layer deposition," *Applied Physics Letters*, vol. 101, p. 234103 (2012).

Seghete et al. "Sacrificial layers for air gaps in NEMS using alucone molecular layer deposition," *Sensors and Actuators A: Physical*, 8 pgs (2009).

U.S. Appl. No. 14/189,265, filed Feb. 25, 2014, entitled, "Cross-Point Memory and Methods for Fabrication of Same."

U.S. Appl. No. 14/189,490, filed Feb. 25, 2014, entitled, "Cross-Point Memory and Methods for Fabrication of Same."

* cited by examiner

CROSS-POINT MEMORY AND METHODS FOR FABRICATION OF SAME

BACKGROUND OF THE INVENTION

Field of the Invention

Subject matter disclosed herein generally relates to integrated circuit devices, and in particular to cross-point memory arrays and methods for fabricating the same.

Description of the Related Art

Generally, a cross-point memory array refers to a memory array having memory elements electrically connected between a first set of conductive lines (e.g., word lines) and a second set of conductive lines (e.g., bit lines), where memory cells are disposed at cross-junctions where the first and second sets of electrodes cross each other. Some cross-point memory arrays incorporate resistance change materials at the cross-junctions. Examples of resistance change materials include phase change materials.

Devices incorporating cross-point arrays having resistance change materials may be found in a wide range of electronic devices. Such devices may be used in computers, digital cameras, cellular telephones, personal digital assistants, etc. Factors that a system designer may consider in determining whether and how to incorporate these devices having resistance change materials for a particular application may include, among other things, physical size, storage density, scalability, operating voltages and currents, read/write speed, read/write throughput, transmission rate, power consumption, and/or methods of forming such devices.

BRIEF DESCRIPTION OF THE DRAWINGS

Claimed subject matter is particularly pointed out in the concluding portion of the specification. However, organization and/or method of operation, together with certain objects, features, and/or advantages thereof, may be better understood by reference to the following detailed description if read with the accompanying drawings in which:

Figure 1:
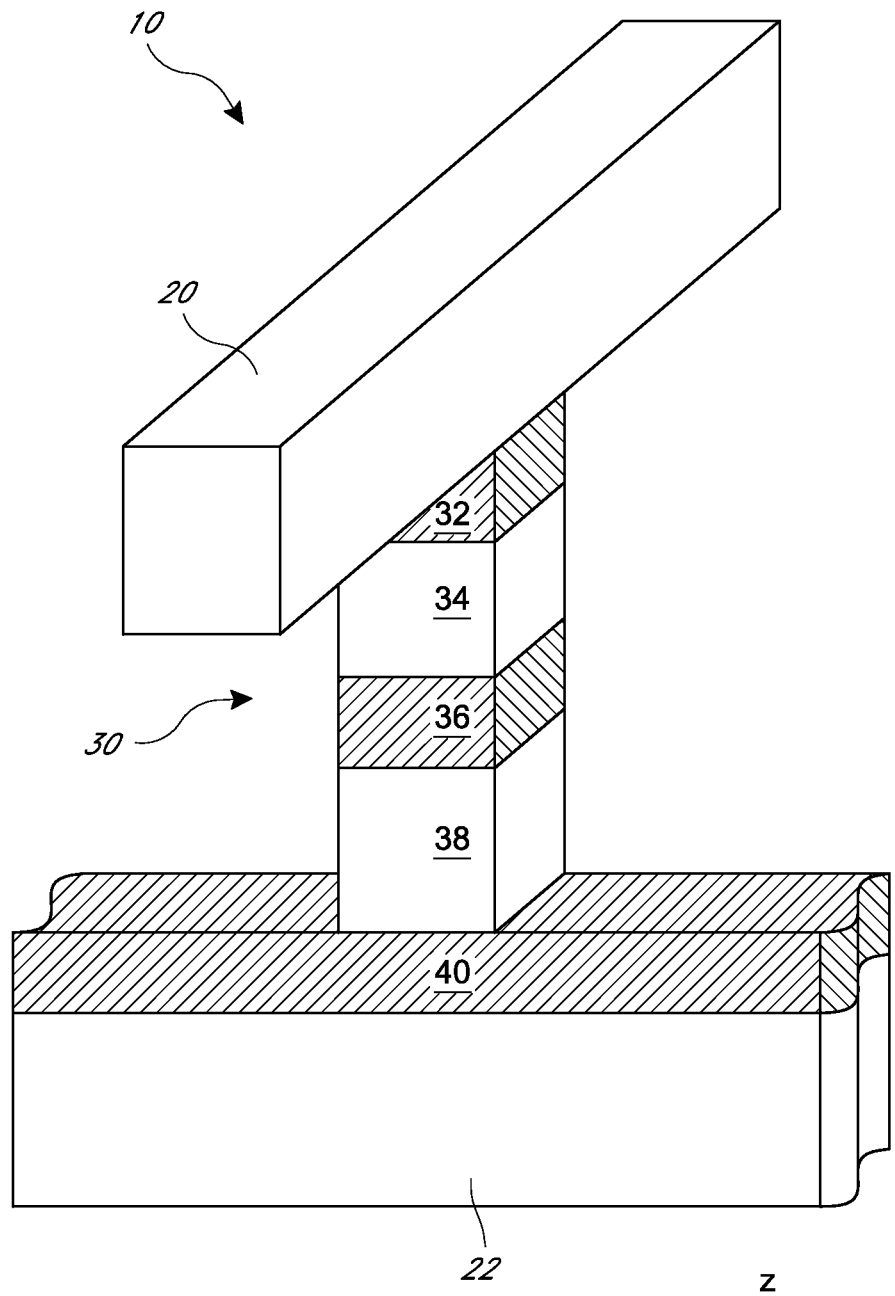
FIG. 1 is a schematic three-dimensional depiction of a memory cell according to some embodiments.

Features in the drawings are not necessarily drawn to scale and may extend in different directions from that illustrated. While various axes and directions are illustrated to facilitate the discussion herein, it will be appreciated that the features may extend in different directions.

DETAILED DESCRIPTION

Generally, a cross-point memory array refers to a memory array having memory elements electrically connected between a first set of conductive lines (e.g., word lines) and a second set of conductive lines (e.g., bit lines), where memory cells are disposed at cross-junctions where the first and second sets of conductive lines cross each other. The memory cells can change their memory state in response to an electrical signal, such as a voltage or a current pulse. Some cross-point memory arrays incorporate resistance change materials at the cross-junctions. Such resistance change materials can change their resistance values under certain bias conditions provided by the first and second conductive lines corresponding to the resistance change materials.

Many forms of resistance change materials exist, whose resistance change mechanisms can vary based on their material compositions. Examples of such resistance change materials include phase change materials. In addition, the resistance state of these materials can be nonvolatile, such that physical and electrical states of the memory devices incorporating them do not change substantially over a retention time (e.g., longer than one year) without any external power supplied thereto. In addition, some resistance change memory devices can provide fast read and write access times (e.g., faster than 10 nanoseconds) and/or high read and write access bandwidth (e.g., greater than 100 megabits per second). Furthermore, some resistance change memory devices can provide several performance advantages over other memory devices, such as flash memory devices and dynamic random access memory devices (DRAM).

U.S. Patent Application No. 2012/0225534 A1 describes a method of fabricating a cross-point array, particularly one incorporating phase change materials in the memory cell stack, with two patterning steps. The first patterning step involves masking and etching lines in blanket layers of a stack of memory cell layers and underlying conductive lines (e.g., word lines). The second patterning step involves filling gaps between the lines left by the first patterning with insulating material, depositing another conductive layer, masking and etching lines (e.g., bit lines) that cross with the underlying lines, which also involves etching through the lines of the memory cell stack, thus leaving pillars of memory cells sandwiched at the intersection of crossing conductive lines.

As the density of memory cells in a memory array increases (e.g., for memory cells having sub-100 nm minimum feature sizes), one consideration in choosing a fabrication process flow can be the aspect ratio of various intermediate structures (e.g., memory cell stack) during processing. The aspect ratio generally becomes higher and more challenging to process with increasing density of memory cells because vertical dimensions and lateral dimensions of the memory cells may not scale at the same rate.

High aspect ratio of intermediate structures during processing can cause many challenges in processing. For example, etching such high aspect ratio structures can require very high etch selectivities when the structures to be etched include lateral regions having different materials. In addition, to achieve the high etch selectivity in different lateral regions, higher demand may be placed on hardmasks. Furthermore, high aspect ratio structures may have inadequate mechanical stability, which may lead to problems such as warping and/or collapsing of the features due to the environment to which the features are exposed. Such environments can include, for example, a plasma environment in which features can be electrostatically charged, or an aqueous environment in which features can experience capillary forces. Furthermore, high aspect ratio structures may be difficult to isolate using available gap-filling processes. Thus, there is a need to reduce aspect ratios of intermediate structures during processing of memory cells. In embodiments described herein, patterning processes can be conducted on intermediate structures with reduced aspect ratios relative, for example, to the process of U.S. Patent Application No. 2012/0225534 A1, and cross-contamination among materials to be patterned can also be reduced.

A method of fabricating a memory device is disclosed below according to some embodiments, including three separate patterning processes. By separating the patterning processes, aspect ratios of intermediate structures being etched can be reduced, thereby mitigating at least the problems discussed above. The method includes patterning a first conductive line extending in a first direction. The method additionally includes forming a free-standing pillar of a memory cell stack on the first conductive line after patterning the first conductive line. The free-standing pillar can be formed by first forming, e.g., depositing, a memory cell material stack that includes a selector material and a storage material over the conductive line and patterning the memory cell material stack to form the free-standing pillar comprising a selector element and a storage element. The method further includes patterning a second conductive line on the pillar after patterning the memory cell stack. The second conductive line extends in a second direction crossing with the first direction such that a memory cell is formed at a cross junction between the first and second conductive lines.

In addition, a memory device is disclosed below according to some embodiments, including a first conductive line extending in a first direction and a second conductive line extending in a second direction crossing the first direction. The memory device additionally includes a pillar of a memory cell stack formed between and electrically connected to the first and second conductive lines. In some embodiments, the pillar of the memory cell stack includes a selector element disposed over the first conductive line and a storage element disposed over the selector element. In other embodiments, the pillar of the memory cell stack includes a storage element disposed over the first conductive line and a selector element disposed over the storage element. The memory device additionally includes an insulating material continuously surrounding a plurality of side surfaces of the pillar.

Furthermore, a method of fabricating a memory cell is disclosed below according to some other embodiments, wherein the method includes providing a substrate and forming, e.g., depositing, a selector material and a storage material over the substrate. The method additionally includes patterning, e.g., etching, the selector and storage material to form a vertical pillar with side surfaces connecting an upper surface with a lower surface, the vertical pillar including a memory cell stack including a storage element and a selector element. The method further includes conformally surrounding the side surfaces of the vertical pillar with an insulating material.

FIG. 1 depicts a memory cell 10 in a cross-point memory array according to one embodiment. The memory cell 10 in FIG. 1 is a resistance change memory cell arranged in a stacked configuration between a column line 20 extending in a y direction and a row line 22 extending in an x direction. Column lines 20 can alternately be referred to as bit lines, or more generally as digit lines, and row lines 22 can alternately be referred to as word lines, or more generally as access lines, by convention in the industry, although these designations can also be reversed. The row and column lines 22 and 20 are conductive lines. The memory cell 10 includes a memory cell pillar 30 including a selector element 38 and a storage element 34, and in the illustrated embodiment these elements are separated by a middle electrode 36. The memory cell 10 additionally includes a first electrode 40 between the selector element 38 and the row line 22 and a second electrode 32 between the column line 20 and the storage element 34.

Other embodiments of the stacked configuration are possible. For example, while the illustrated embodiment in FIG. 1 shows the first electrode 40 configured as a line structure laterally confined in one dimension and extending above the column line 22 and the second electrode 32 configured as a structure laterally confined in two dimensions, the opposite configuration is possible, where the first electrode 40 is configured as a structure laterally confined in two dimensions and the second electrode 32 is configured as a line structure laterally confined in one dimension and extending below the row line 20. In other embodiments, both the first and second electrodes 40 and 32 can be laterally confined in one or two dimensions. For example, the positions of the storage element 34 and the selector node 38 within a stack configuration may be interchanged with one another. In other examples, any one of the first, second, and middle electrodes may be omitted, depending upon compatibility or reactivity of adjacent materials. Additionally, the "row" and "column" designations are interchangeable, and the rows and columns are generally perpendicular but may cross one another at other than 90°.

Examples of the storage element 34 include chalcogenide-based phase change materials, resistive oxide cells (e.g., NiO, $HfO_2$, $ZrO_2$, $Cu_2O$, $TaO_2$, $Ta_2O_5$, $TiO_2$, $SiO_2$, $Al_2O_3$), conductive bridge random access memory (CBRAM) cells (e.g., metal-doped chalcogenide), and/or spin transfer torque random access memory (STT-RAM) cells, among other types of memory cells.

Examples of the selector element 38 include two terminal devices, such as a diode, an ovonic threshold switch (OTS), a tunnel junction, or a mixed ionic electronic conduction switch (MIEC), among other two terminal devices. Alternatively, examples of the selector element 38 comprise a three terminal device, such as a field effect transistor (FET) or a bipolar junction transistor (BJT), among other switching elements.

In some embodiments, one or both of the storage and selector elements 34 and 38 can comprise chalcogenide materials. When both storage and selector elements 34 and 38 comprise chalcogenide materials, the storage element 34 can comprise a chalcogenide material that can undergo a phase change that is nonvolatile at room temperature. On the other hand, the selector element 38 can comprise a chalcogenide material that does not undergo a similar nonvolatile phase change.

In some embodiments, the storage element 34 includes a phase change material that includes chalcogenide compositions such as an alloy including at least two of the elements within the indium(In)-antimony(Sb)-tellurium(Te) (IST) alloy system, e.g., $In_2Sb_2Te_5$, $In_1Sb_2Te_4$, $In_1Sb_4Te_7$, etc., an alloy including at least two of the elements within the germanium(Ge)-antimony(Sb)-tellurium(Te) (GST) alloy system, e.g., $Ge_8Sb_5Te_8$, $Ge_2Sb_2Te_5$, $Ge_1Sb_2Te_4$, $Ge_1Sb_4Te_7$, $Ge_4Sb_4Te_7$, etc., among other chalcogenide alloy systems. The hyphenated chemical composition notation, as used herein, indicates the elements included in a particular mixture or compound, and is intended to represent all stoichiometries involving the indicated elements. Other chalcogenide alloy systems that can be used in phase change storage elements include Ge—Te, In—Se, Sb—Te, Ga—Sb, In—Sb, As—Te, Al—Te, In—Ge—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example.

In some embodiments, the selector element 38 includes a chalcogenide material electrically coupled to the storage element 34 through the middle electrode 36 on one side and electrically connected to the row line 22 through the first electrode 40 on the other side. A selector device having a chalcogenide material can sometimes be referred to as an Ovonic Threshold Switch (OTS). An OTS may include a chalcogenide composition including any one of the chalcogenide alloy systems described above for the storage element 34. In addition, the selector element may further comprise an element to suppress crystallization, such as arsenic (As). Examples of OTS materials include Te—As—Ge—Si, Ge—Te—Pb, Ge—Se—Te, Al—As—Te, Se—As—Ge—Si, Se—As—Ge—C, Se—Te—Ge—Si, Ge—Sb—Te—Se, Ge—Bi—Te—Se, Ge—As—Sb—Se, Ge—As—Bi—Te, and Ge—As—Bi—Se, among others.

According to another embodiment, the selector element 38 includes a semiconductor material that can form parts of semiconductor-based selector devices such as bipolar junction transistors (BJT). For example, in one embodiment, selector element 38 can be a semiconductor region which forms an emitter region of a BJT (NPN or PNP). In this embodiment, the selector element 38 can be connected to the row line 22 that can serve as a base region of the BJT. In some embodiments, the row line 22 can serve as a common base region electrically connecting a plurality of BJTs as selector elements.

The electrodes 32, 36 and 40 can comprise materials that electrically connect the operational elements of the memory cell but prevent reactions among the materials. For example, where the storage element 34 and the selector element 38 comprise chalcogenide materials, it may be advantageous to place non-reactive conductors between these elements to prevent interdiffusion of their materials, and also between these elements and their respective neighboring conductive lines, particularly where those line are formed of metals. Examples of suitable electrode materials include carbon, tungsten, titanium, and metal nitrides such as titanium nitride, or tungsten nitride.

In the following, it will be understood that while some embodiments of memory cells may be described as having certain features pertaining to storage elements and selector elements that include chalcogenide materials, the embodiments are not limited to such storage and selector elements. For example, in some embodiments, a memory cell can include a storage element including a chalcogenide phase change material, while including a selector element that does not include a chalcogenide material, such as a bipolar junction transistor or a diode. In some other embodiments, another material with similar electrical behavior as the chalcogenide phase change material may be used in place of that chalcogenide phase change material. In some other embodiments, a memory cell can include a selector element including an Ovonic threshold switching material, while including a storage element that does not include a chalcogenide material, such an oxide-based resistance change oxide material. In yet other embodiments, a memory cell can include a chalcogenide phase change material having both storage and selector functionalities without separate selector elements for these functions.

FIGS. 2A-2J are schematic three-dimensional depictions illustrating a method of fabricating memory array structures at various stages of fabrication according to some embodiments. As described above, the method comprises patterning intermediate structures for fabrication of a cross-point memory array. FIGS. 2A-2C, FIGS. 2D-2G and FIGS. 2H-2J illustrate the results of first, second, and third patterning processes.

While not shown for clarity and ease of illustration, it will be understood that the illustrated array structures are formed over a substrate 2, which can include other among other things various periphery and supporting circuitry, for instance CMOS transistors that form a part of column and row driver circuitry and sense amplifier circuitry, as well as sockets and wiring that connect such circuitry to the memory array through the columns and rows described above. In addition, the substrate 2 may include one or more memory arrays, or "decks" of arrays. As used herein, the term substrate includes a bulk semiconductor substrate as well as integrated structures formed thereover.

Figure 2A:
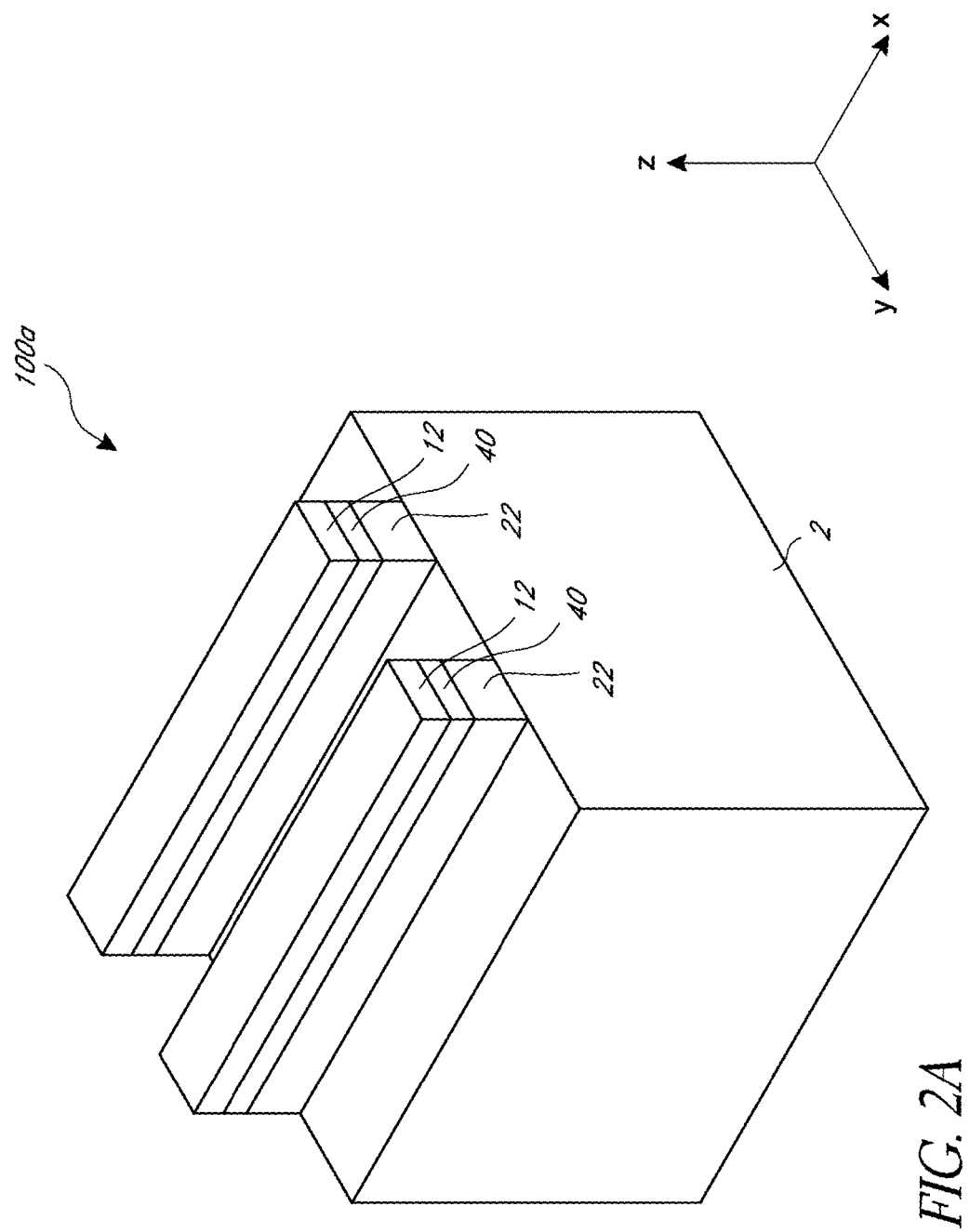
FIGS. 2A-2J are schematic three-dimensional depictions of structures of a memory cell at various stages of fabrication according to some embodiments.

FIG. 2A illustrates a first intermediate array structure 100a comprising a first conductive line, which can be a row line 22, extending in a first direction according to one embodiment. A method of fabricating the first intermediate array structure 100a includes providing a substrate 2, which can include various features as discussed above. The method additionally includes forming, e.g., depositing, a first conductive material stack of blanket layers including a first conductive material, a first electrode material, and a first hard mask material over the substrate 2. The first conductive material stack is subsequently subtractively patterned in a first patterning process to form a first conductive line stack extending in the x-direction. After patterning, the first conductive line stack comprises the row line 22 over the substrate 2, a first electrode line 40 on the row line 22, and a first hard mask line 12 on the first electrode line 40.

As used herein and throughout the specification, "subtractive patterning" refers to a process sequence where structures to be defined are patterned by the removal of material. For example, a "subtractive patterning process" may include first lithographically providing etch mask structures overlapping areas to be patterned, followed by etching, such that materials in areas masked by the mask structures are protected while materials in exposed areas are removed by the etch removal process. The set of process steps for subtractive-patterning a stack of layers, can include, for example, providing an etch mask pattern that can comprise at least one of a photoresist, one or more hard masks, and an anti-reflective coatings, among others by a photolithography process. Other lithographic techniques are also possible, including processes without hard mask layers. The etch mask pattern blocks areas covered by the mask pattern to protect the underlying material from being etched by an etchant (e.g., wet or dry), while the etch mask pattern exposes areas not covered by the mask pattern to etch the exposed region to be etched by the etchant.

In FIG. 2A, subtractively patterning the first conductive line stack includes forming first mask lines extending in the x-direction. The first mask line can be formed by patterning a photoresist or an initial hard mask, for example. Subsequently, exposed regions of the first conductive material stack between the first mask lines are etched. In FIG. 2A, the first conductive material stack is etched from the top, in the order of the first hard mask material, the first electrode material, and the first conductive material, whereby the first conductive line stack if formed, comprising the row line 22, the first electrode line 40 on the row lines 22, and the first hard mask line 12 on the row line 22. Spaces separate adjacent lines of the first conductive stack.

Still referring to FIG. 2A, the first conductive material of the row line 22 can include a suitable conductive and/or doped semiconductive material for forming row lines 22 that carry electrical current for accessing the memory array. Examples of the first conductive material include n-doped poly silicon, p-doped poly silicon, metals including Al, Cu, and W, conductive metal nitrides including TiN, TaN, and TaCN, among others. In one embodiment, the row line 22 comprises a relatively thick (e.g., about 120 nm to 180 nm) metal, particularly tungsten, for sufficient signal speed across the array.

In some embodiments, the first electrode material is included to separate incompatible materials, such as the metal of the row line 22 from the material of the selector element to be formed thereover. In some embodiments, the first electrode material comprises carbon, such as about 20 nm to 30 nm in thickness. In other embodiments, the first electrode material comprises relatively thin metallic materials, such as about 2 nm to 30 nm of tungsten, titanium or titanium nitride. However, other embodiments are possible, depending upon the other materials in the memory cell. For example, the first electrode material can comprise any suitable conductive and semiconductive materials including, for example, n-doped poly silicon and p-doped poly silicon; metals including Al, Cu, Ni, Cr, Co, Ru, Rh, Pd, Ag, Pt, Au, Ir, Ta; conductive metal nitrides including TiN, TaN, WN, and TaCN; conductive metal silicides including tantalum silicides, tungsten silicides, nickel silicides, cobalt silicides and titanium silicides; and conductive metal oxides including $RuO_2$.

The first hard mask can include a suitable material to provide sufficient etch protection of the first conductive material and the first electrode material while the entire stack of the first conductive line stack is etched. For example, the first hard mask can include a suitable oxide or a nitride material, including silicon oxide, silicon oxynitride and silicon nitride.

Figure 2B:
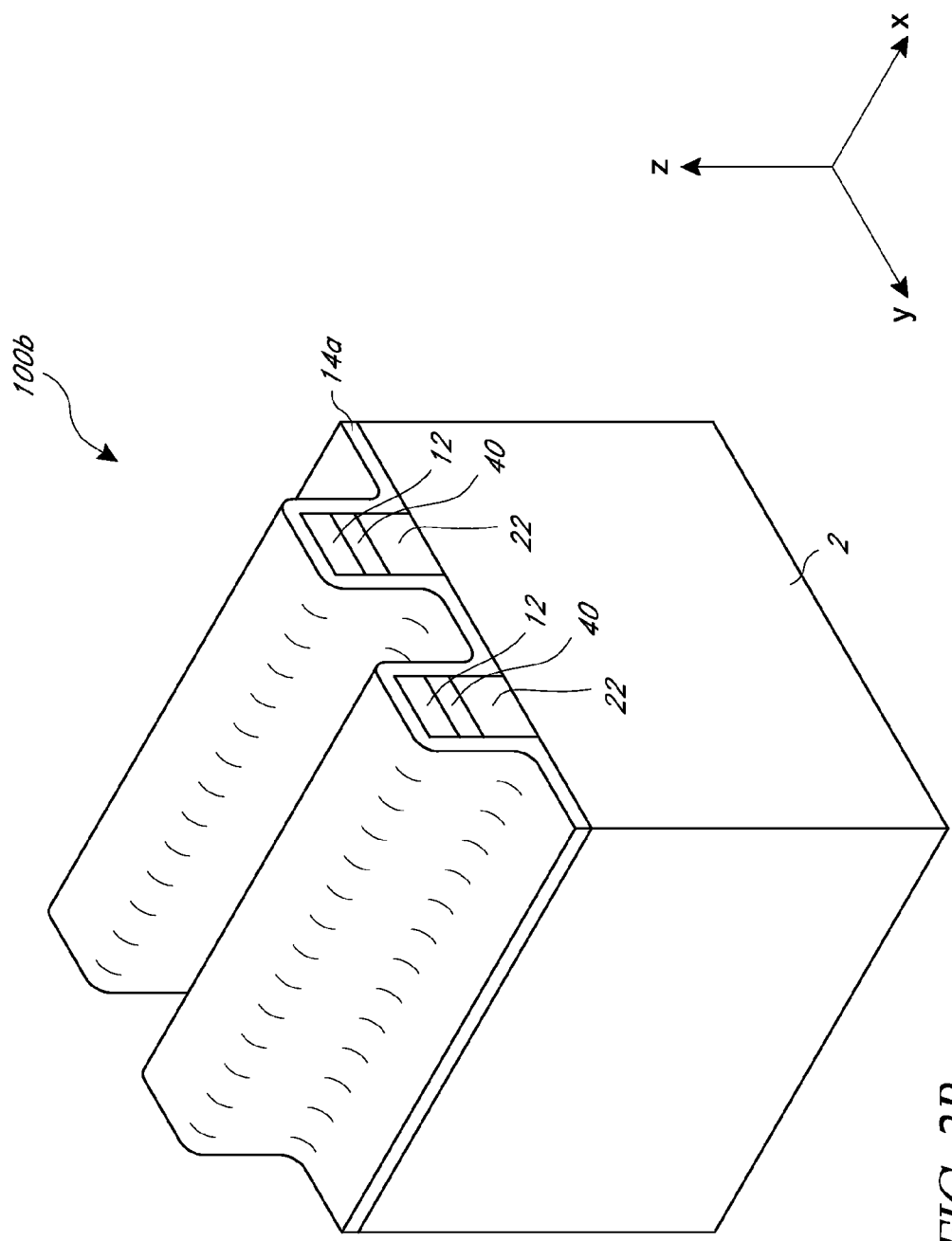

Referring to FIG. 2B, fabricating a first intermediate array structure 100b comprises forming a first liner material 14a over the first conductive line stack described above in FIG. 2A, according to one embodiment. In some embodiments, the first liner material 14a is a conformal material which uniformly covers the sidewalls of the first conductive line stack. When conformal, the thicknesses of the first liner material 14a on opposite sidewalls may be substantially the same. In addition, the first liner material 14a may also conformally cover a top of the first hard mask line 12 and may also extend to further conformally cover bottom surfaces of inter-line spaces adjacent the first conductive line stack.

The first liner material 14a can include a suitable dielectric to protect the first conductive line stack from subsequent processes such as subsequent gapfill processes. The first liner material 14a can include oxide or nitride materials, such as silicon oxide (e.g., $SiO_2$), aluminum oxide (e.g., $Al_2O_3$) and silicon nitride (e.g., $Si_3N4$), among others. In general, the first liner material 14a can be formed by a suitable conformal deposition technique such as chemical vapor deposition (CVD) and atomic layer deposition (ALD), including thermal and plasma deposition techniques.

Still referring to FIG. 2B, in some embodiments, the first hard mask line 12, the first electrode line 40 and the row line 22 can have a lateral dimensions, which can also be referred to as widths, in the y-direction selected to be in the range between about 20 nm and 60 nm, for example about 40 nm. For example, in some embodiments, the width dimensions can be selected to be the range between about 25 nm and 40 nm, for example 35 nm. In other embodiments, the width dimensions can be selected to be the range between about 14 nm and 24 nm, for example 20 nm. Smaller dimensions are yet possible, limited only by the lithographic capability employed by the person skilled in the art. The elongated lines can ban have lengths in the x-direction much greater than the width dimensions, such as greater than 100 times the width dimensions.

In addition, the first liner material 14a has thickness selected be in a range between about 3 nm and 10 nm, for example about 5 nm.

Figure 2C:
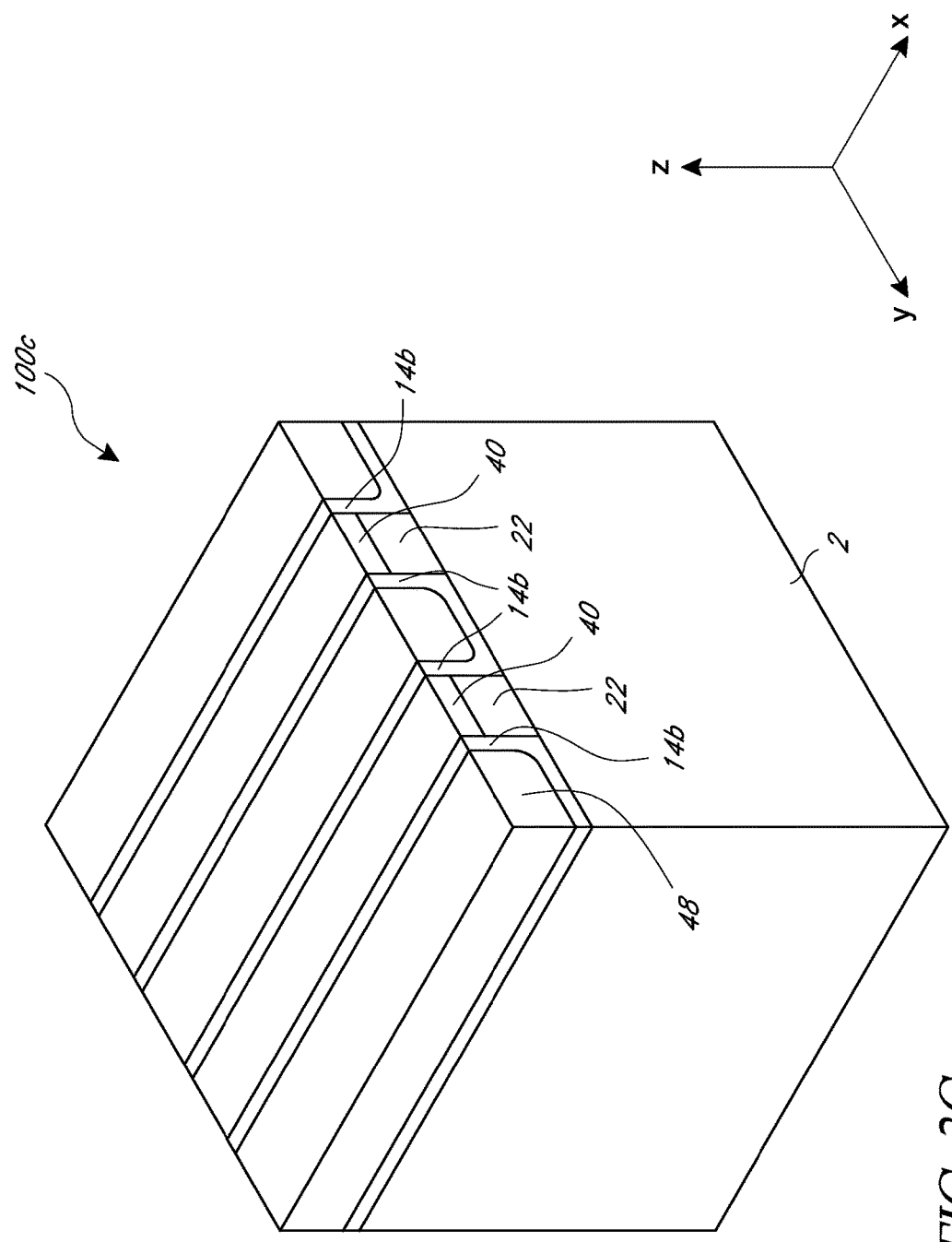

Referring to FIG. 2C, fabricating a first intermediate array structure 100c comprises filling inter-line spaces adjacent the first conductive line stacks described in FIG. 2B, by forming, e.g., depositing, an isolation dielectric over the first conformal liner material 14a described in FIG. 2B, according to one embodiment. The spaces are adjacent the first conductive line stack comprising the row line 22, the first electrode line 40 and the first hard mask line similar to FIG. 2A. The spaces are filled with an isolation dielectric to form first isolation dielectric regions 48. A suitable dielectric can include, for example, dielectric materials capable of filling spaces having relatively small space widths (e.g., less than about 100 nm) and relatively high aspect ratios (e.g., higher than about 3:1 in height to width ratio of the space). Suitable isolation dielectric materials include silicon oxides and silicon nitrides deposited by high-density plasma (HDP) processes, spin-on-dielectric (SOD) processes, sub-atmospheric chemical vapor deposition (SACVD) processes, and atomic layer deposition (ALD) processes, among others. The first conformal liner material 14a, if present, can protect the row line 22 from damage during energetic gap-fill processes, such as HDP-CVD.

Once the inter-line spaces are filled with the suitable isolation dielectric to form the first isolation dielectric regions 48, the first intermediate array structure 100c can be chemical-mechanically polished (CMP) to remove excess isolation dielectric. The CMP can further remove the first hard mask line 12 and portions of the first liner material 14a over the hard mask line 12. The CMP process provides a substantially planarized surface comprising alternating lines of exposed first electrode lines 40 and isolation dielectric regions 48, interposed by exposed lines 14b of the first liner material 14a.

Figure 2D:
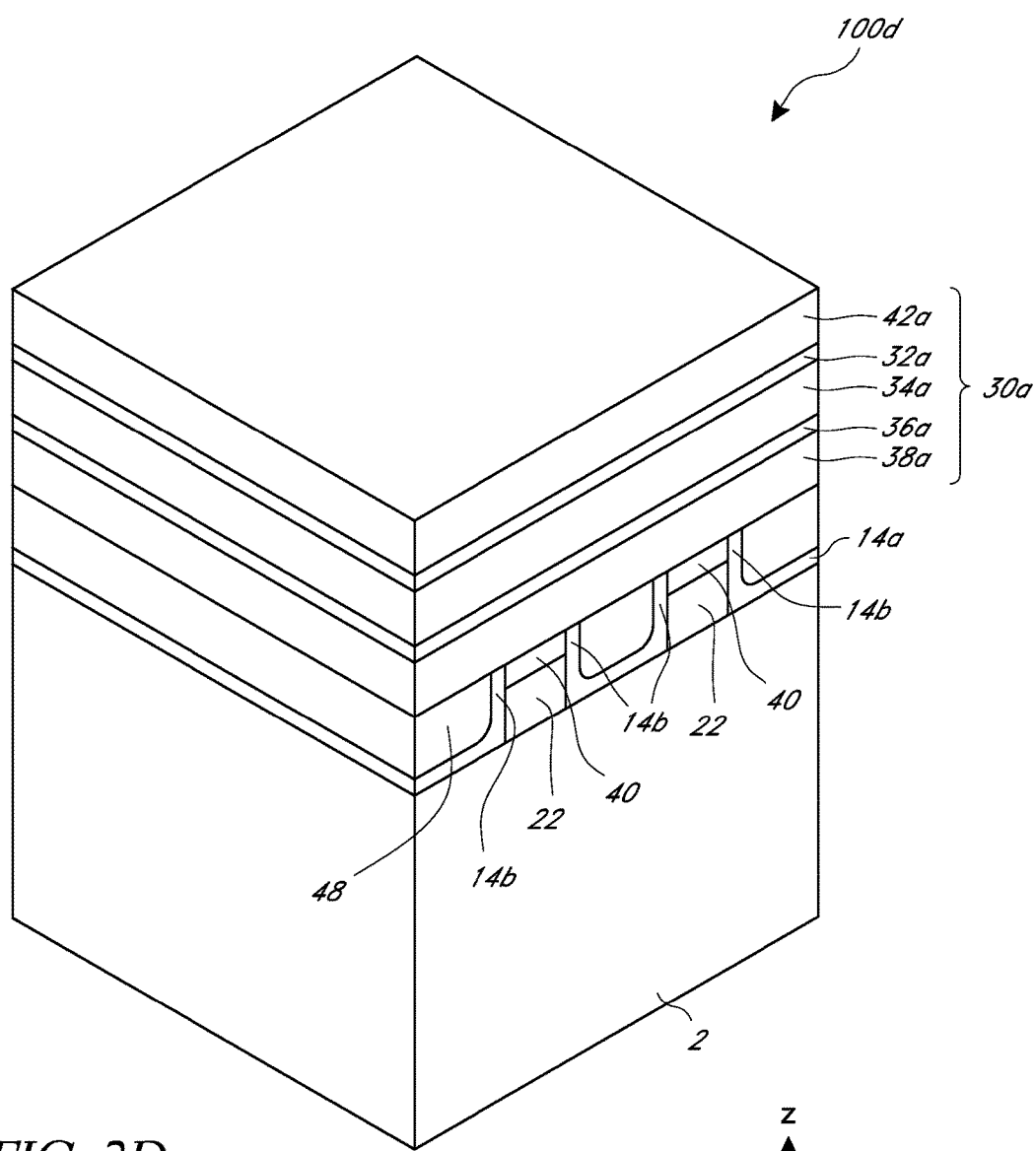

FIG. 2D illustrates fabricating a second intermediate array structure 100d comprising a memory cell material stack 30a, according to one embodiment. Forming the memory cell material stack 30a includes, for example, blanket depositing a selector material 38a over the first intermediate structure 100c of FIG. 2C, depositing a middle electrode material 36a over the selector material 38a, depositing a storage material 34a over the middle electrode material 36a, depositing a second electrode material 32a over the storage material 34a, and depositing a second hard mask layer 42a over the second electrode material 32a.

In FIG. 2D, the selector material 38a can comprise a suitable selector material similar to those discussed above in connection with the selector element 38 in FIG. 1. In addition, the middle and second electrode materials 36a and 32a can comprise a suitable conductive material discussed above in connection with the first electrode line 40 in FIG. 2A. In addition, the storage material 34a can comprise a suitable storage material similar to those discussed above in connection with the storage element 34 in FIG. 1. Furthermore, the second hard mask material 42a can comprise a suitable hard mask material similar to those discussed above in connection with the first hard mask line 12 in FIG. 2A.

Figure 2E:
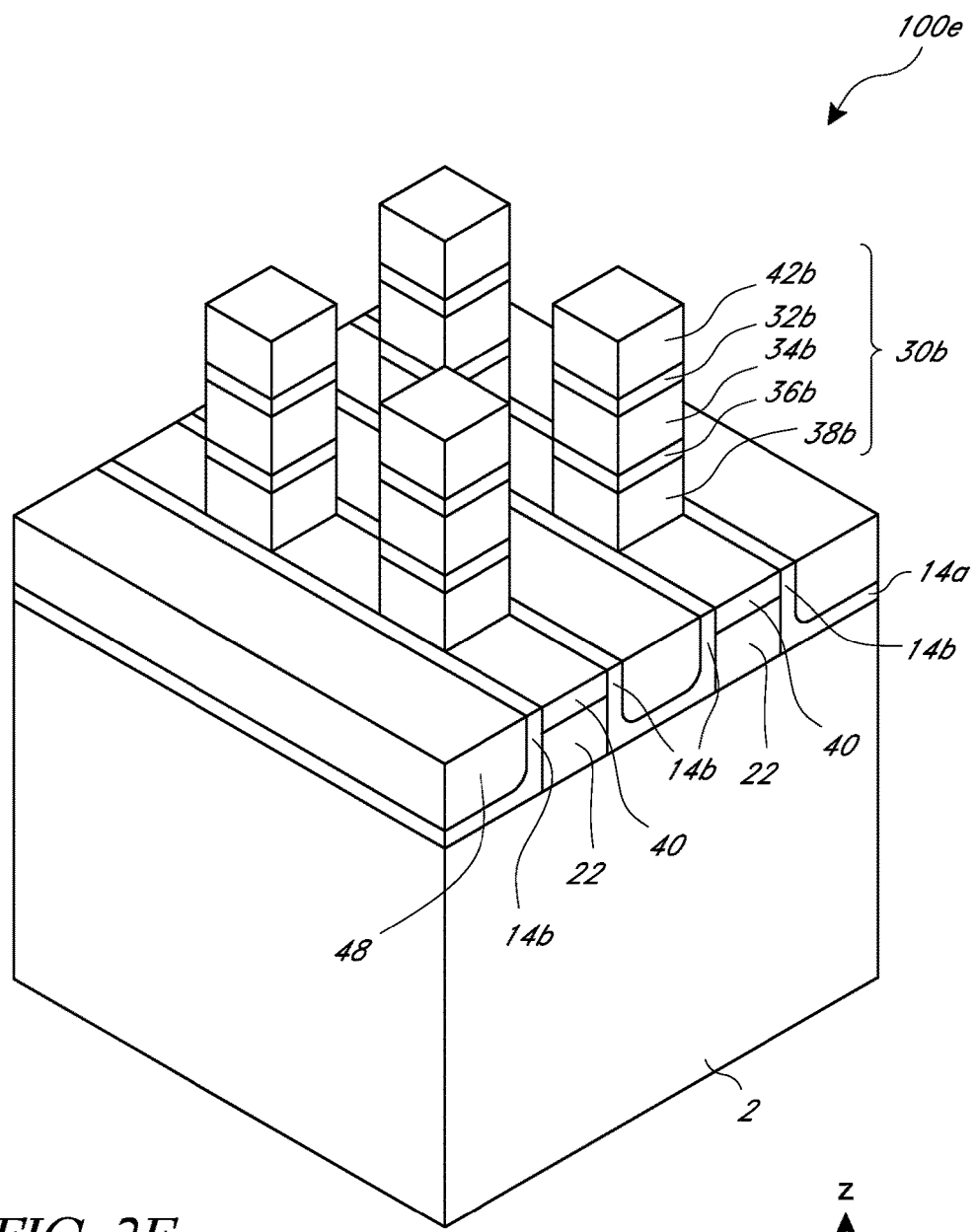

FIG. 2E illustrates fabricating a second intermediate array structure 100e comprising subtractively patterning the memory cell material stack 30a of FIG. 2D in a second patterning process to form the free-standing pillar 30b of the memory cell stack at least partially overlapping the row line 22. Subtractively patterning to form the free-standing pillar 30b includes etching the memory cell material stack 30a of FIG. 2D, in the order of etching the second hard mask material 42a, followed by the second electrode material 32a, followed by the storage material 34a, followed by the middle electrode material 36a, followed by the selector material 38a, and stopping on a surface of the first intermediate array structure 100c of FIG. 2C.

After subtractively patterning, the free-standing pillar 30b of the memory cell stack comprises a hard mask island 42b on a second electrode 32b, the second electrode 32b on a storage element 34b, the storage element 34b on a middle electrode 36b, the middle electrode 36b on a selector element 38b, and the selector element 36b at least partially overlapping a surface of the first electrode line 40 that was exposed in FIG. 2C.

In some embodiments, the second patterning process employs a single photo mask to subtractively pattern the free-standing pillar 30b. In these embodiments, the hard mask island 42b can be patterned using a "dot mask" formed using a resist or an initial hard mask. The "dot mask" and the resulting lateral shape of the free-standing pillar 30b can be any suitable shape selected for process or device considerations. For example, the shape can be substantially square (as shown), round, ovular, rectangular, etc. The hard mask island 42b can then be used as an etch blocking layer to etch the remainder of the memory cell stack 30a including the second electrode material 32a, the storage material 34a, the middle electrode material 36a and the selector material 38a to form the free-standing pillar 30b.

In other embodiments, the second patterning process employs two masks to pattern the free-standing pillar 30b. The two masks can define crossing lines of mask material that superimpose to define isolated dots. Either the two masks can sequentially pattern lines in the memory cell stack 30a followed by patterning the lines into pillars 30b, or the two patterns can be consolidated into a hard mask layer as a "dot mask" which can be employed as described above.

Still referring to FIG. 2E, in some embodiments, the hard mask island 42b, the second electrode 32b, the storage element 34b, the middle electrode 36b and the selector element 36b can have first lateral dimensions in the x-direction and second lateral dimensions in the y-direction that are selected to be in ranges similar to those discussed above in connection with the width dimensions of the row line 22, the first electrode line 40 and the first hard mask line 12 in connection with FIG. 2B.

Still referring to FIG. 2E, in some embodiments, the selector element 38b has a third thickness, the middle electrode 36b has a fourth thickness, the storage element 34b has a fifth thickness, and the second electrode 32b has a sixth thickness. In one embodiment, the third thickness is selected to be the range between about 5 nm and 50 nm, for example 25 nm, the fourth thickness is selected to be the range between about 10 nm and 100 nm, for example 25 nm, the fifth thickness is selected to be the range between about 10 nm and 50 nm, for example 25 nm, and the sixth thickness is selected to be the range between about 10 nm and 100 nm, for example 25 nm.

In addition, the hard mask island 42b can have a thickness selected to be in a range between about 20 nm and 60 nm, for example about 35 nm.

Figure 2F:
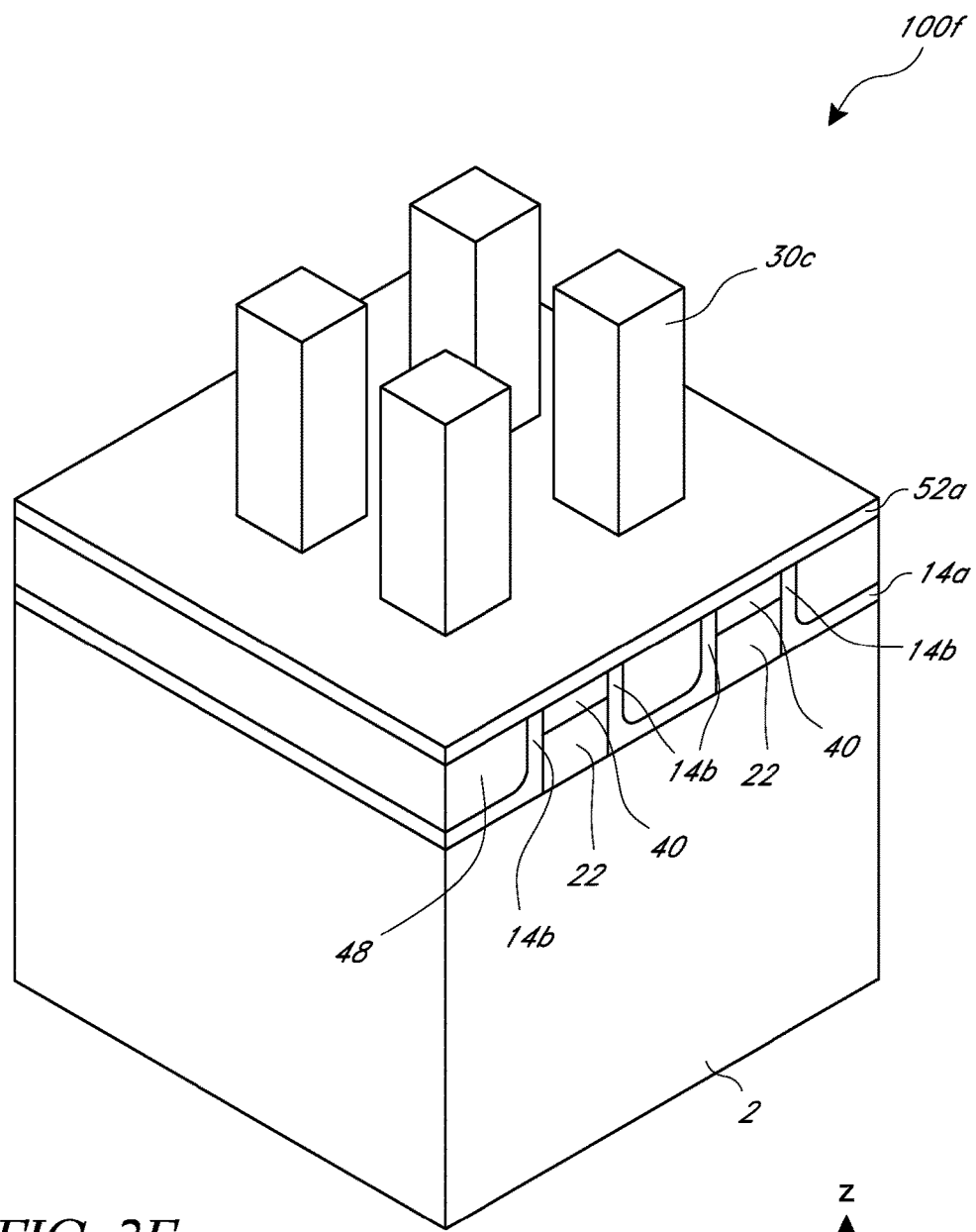

FIG. 2F illustrates further processing to produce a second intermediate array structure 100f comprising uniformly covering a plurality of surfaces of the free-standing pillar 30b of FIG. 2E to form a conformally lined free-standing pillar 30c, including covering a top surface and a plurality of side surfaces of the free-standing pillar 30b of FIG. 2E, with a second liner material 52a. The areas covered by the second liner material 52a additionally includes the exposed regions of the substantially planarized surface as discussed in connection with FIG. 2C, which includes alternating lines of exposed first electrode lines 40 and isolation dielectric regions 48, interposed by exposed lines of the first liner material 14b.

In some embodiments, the second liner material 52a covering the conformally lined free-standing pillar 40c comprises similar materials as well as similar thicknesses as the first liner material 14a described in connection with FIG. 2B.

Figure 2G:
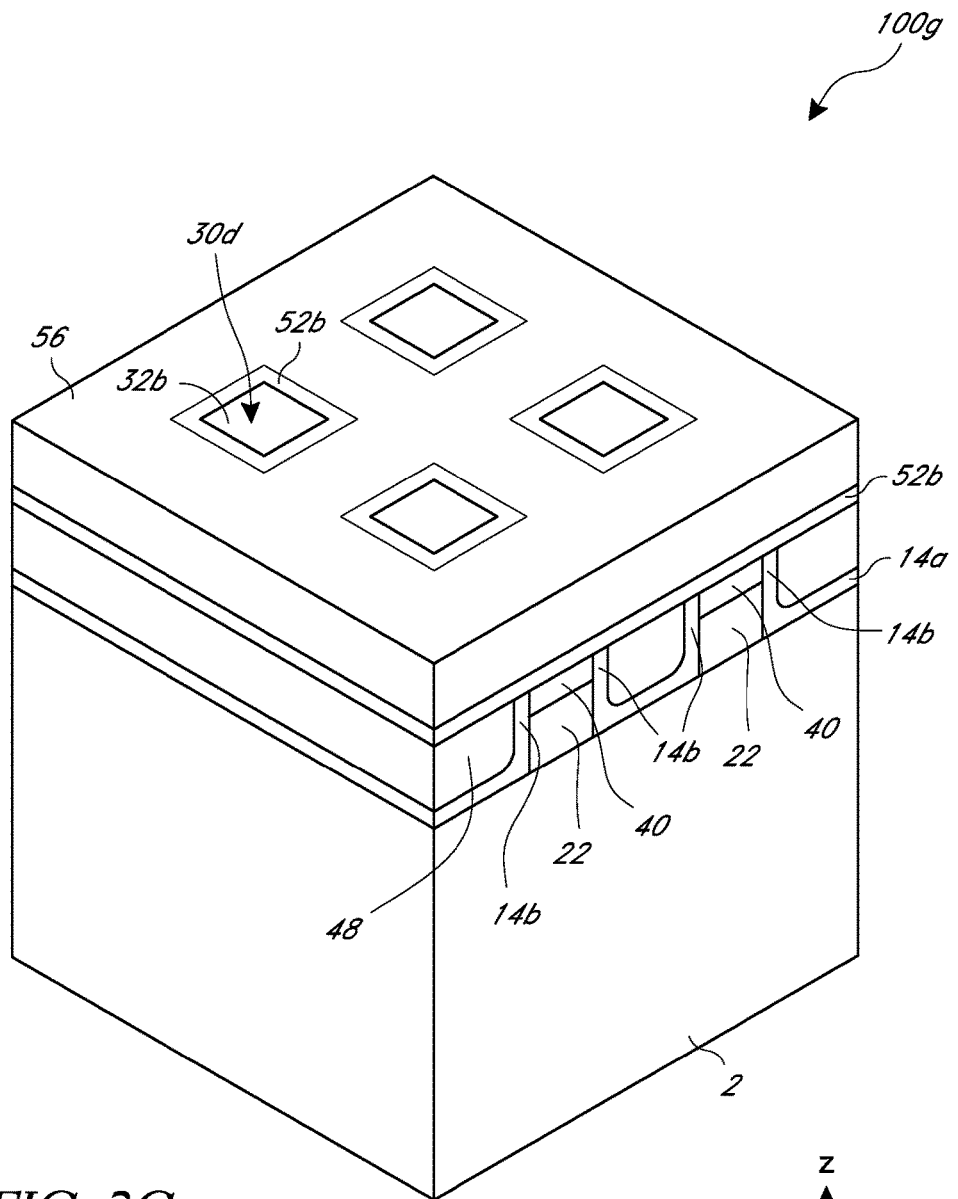

Referring to FIG. 2G, fabricating the second intermediate array structure 100g comprises filling spaces adjacent the conformally lined free-standing pillar 30c, according to one embodiment. The spaces adjacent and surrounding the free-standing pillar 30c are filled with a suitable gap-fill isolation dielectric to form a second isolation dielectric layer 56. A suitable gap-fill isolation dielectric material includes similar materials as those described in connection with the first isolation dielectric regions 48 of FIG. 2C, including, for example, silicon oxides and silicon nitrides deposited by high-density plasma (HDP) processes, spin-on-dielectric (SOD) processes, sub-atmospheric chemical vapor deposition (SACVD) processes, and atomic layer deposition (ALD) processes, among others.

In addition, also similar to FIG. 2C, once the spaces surrounding the free-standing pillar 30c (FIG. 2F) are filled to form the second isolation dielectric layer 56, the second intermediate array structure 100g may be chemical-mechanically polished (CMP) to remove excess isolation dielectric. The CMP may further remove the second hard mask island 42b and portions of the second liner material 52a over the second hard mask island 42b. The CMP process provides a substantially planarized surface comprising an exposed surface of the second electrode 32b of a planarized pillar 30d continuously surrounded by a dielectric material in the form of the second liner material 52b, which is in turn surrounded by the second isolation dielectric layer 56.

It will be appreciated that forming the free-standing pillar 30b as illustrated in FIG. 2E advantageously allows surrounding the sidewalls of the free-standing pillar 30b with dielectric material, without any dielectric interfaces extending into the functional elements of the memory cell stack. In the illustrated embodiment, the second liner material 52a using a single deposition process forms uniform and conformal coverage of the free-standing pillar 30b and the adjacent exposed surfaces, producing a continuously (laterally) surrounding dielectric. Providing the uniform and conformal coverage using a single deposition process may provide the second liner material that is free of interfacial regions that may result from forming the liner material using multiple processes as may be the case when the free-standing pillar 30b is formed using more than a single mask process and a liner material is deposited on surfaces that are exposed after each masking process. In other embodiments, even if the liner material 52a is omitted, the gap-fill second isolation dielectric layer 56 can provide the continuously surround surrounding dielectric that is free of interfaces extending in toward the functional portions of the memory cell stack.

It will be further appreciated that filling the spaces surrounding the free-standing pillar 30b allows filling the spaces surrounding the free-standing pillar 30b or 30c using a single deposition process to form the second isolation dielectric layer 56 that is free of interfacial regions. Such interfaces would result from filling gaps in the x- and y-directions using multiple processes. For example, if free-standing pillars were formed using multiple patterning processes having multiple etching processes, followed by separate depositions of isolation dielectric after each patterning process, a single dielectric material or layer would not continuously surround the pillars, but rather multiple dielectrics with interfaces between them, where the interfaces extend inward to contact the pillars. Such interfaces would be visible when viewed in a cross section, such as in an electron microscopy sample prepared for a cross-sectional imaging.

Figure 2H:
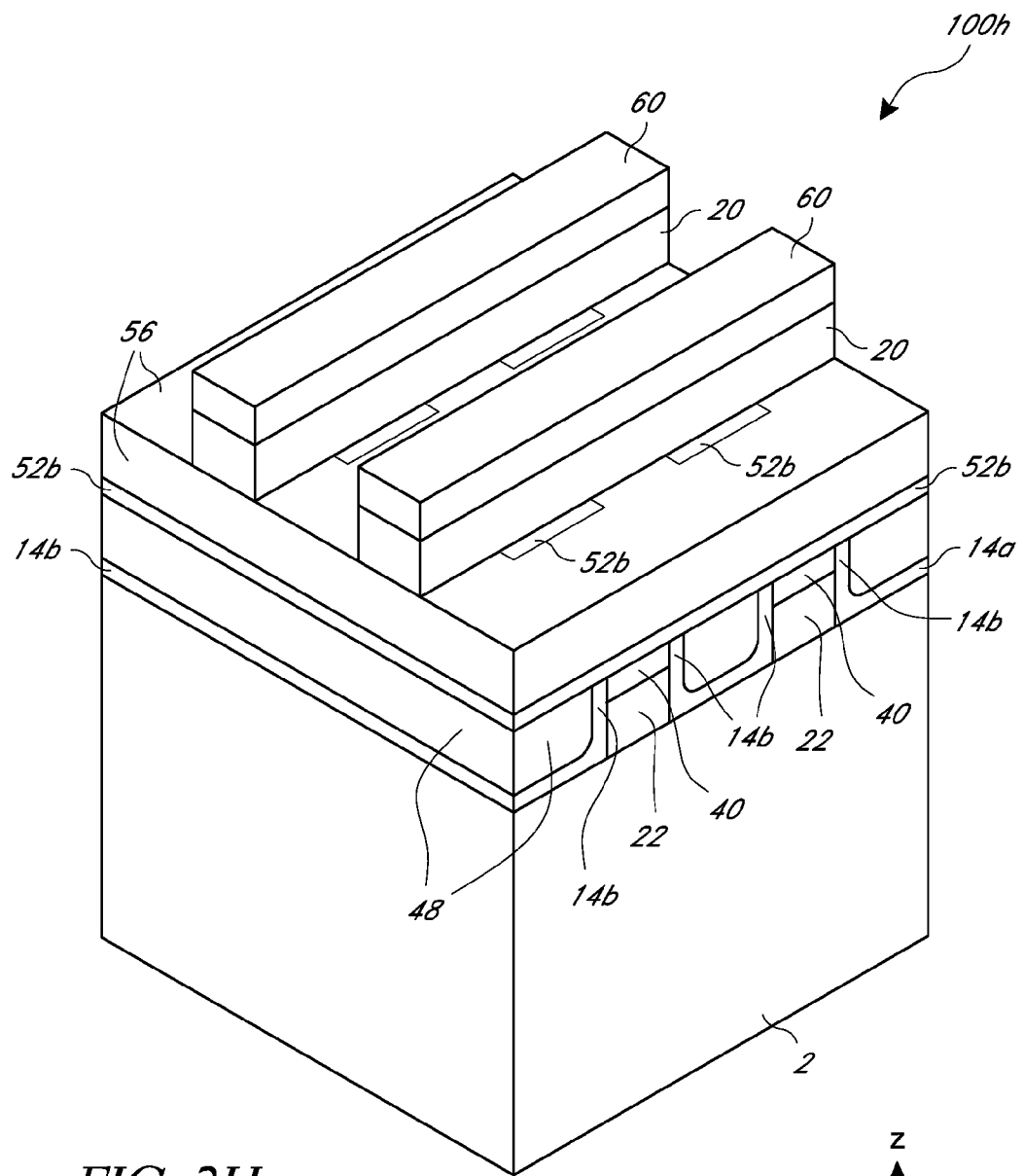

FIG. 2H illustrates fabricating a third intermediate structure 100h comprising a second conductive line, which can be a column line 20, over the planarized surface of the planarized pillar 30d surrounded and supported by the second liner material 52a, according to one embodiment. The column line 20 extends in a second direction (e.g., y-direction) crossing the first direction (e.g., x-direction) in which the row line 22 extends, according to one embodiment. The method includes depositing a second conductive material stack including depositing a second conductive material over the planarized pillar 30d and depositing a third hard mask material on the second conductive material. The method additionally includes patterning a second conductive material stack by subtractively patterning the second conductive material stack in a third patterning process to form a second conductive line stack extending in the y-direction. The second conductive line stack comprises the column line 20 formed over the planarized pillar 30d and a third hard mask line 60 on the column line 20.

In FIG. 2H, subtractively patterning the second conductive line stack can include forming an etch mask pattern comprising mask lines, such as a photoresist or an initial hard mask, extending in the y-direction. Subsequently, exposed regions of the second conductive material stack between the lines of the etch mask pattern are etched. The second conductive material stack is etched from the top, in the order of the third hard mask material and the second conductive material. The resulting second conductive line stack comprises the column line 20 and the third hard mask line 60 on the column line 20. The conductive line stack is disposed between adjacent spaces.

Still referring to FIG. 2H, the second conductive material includes a suitable conductive or doped semiconductive material similar to that described in connection with the first conductive material in FIG. 2A. In addition, the third hardmask line 60 includes a suitable material to provide sufficient etch protection of the second conductive material during etch, similar to the first hardmask line 12 in FIG. 2A. The hard mask line 60 typically comprises a dielectric, such as silicon nitride or silicon oxynitride.

Figure 2I:
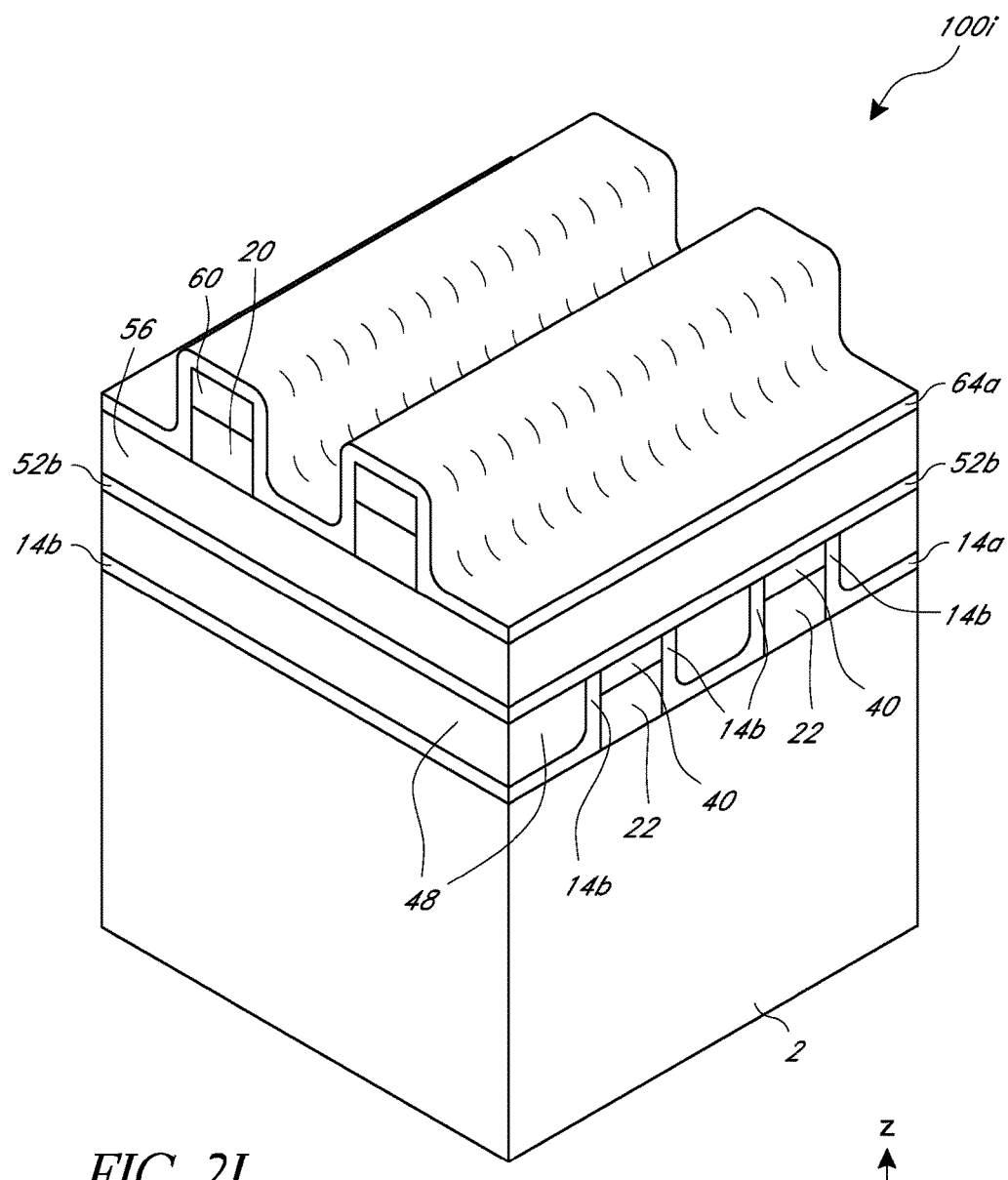

FIG. 2I illustrates further processing the third intermediate array structure 100i by forming, e.g., depositing, a third conformal liner material 64a over the second conductive line stack, including the column line 20 and the second hard mask line 60, according to one embodiment. The third conformal liner material 64a conformally covers the top of the third hard mask line 60 as well as the sidewalls of the second conductive line stack. The third conformal liner material 64a extends to further uniformly cover the bottom surfaces of spaces or gaps adjacent the second conductive line stack.

The third liner material 64a include a suitable dielectric to protect the sidewalls of the second conductive line stack, similar to the first liner material 14a of FIG. 2B, including oxide and nitride materials which can be formed using a suitable conformal deposition technique such as CVD or ALD, including thermal and plasma deposition techniques.

Still referring to FIG. 2I, in some embodiments, the second hard mask line 60 and the column line 20 can have a lateral dimensions in the x-direction, which can also be referred to as width dimensions for the elongated lines, selected to be in a range between about 40 nm and 60 nm, for example 50 nm. In other embodiments, the lateral dimensions can be selected to be the range between about 25 nm and 40 nm, for example 35 nm. In other embodiments, the lateral dimensions can be selected to be the range between about 14 nm and 24 nm, for example 20 nm. Smaller dimensions are yet possible, limited only by the lithographic capability employed by the person skilled in the art.

Still referring to FIG. 2I, in some embodiments, the column line 20 comprises a relatively thick (e.g., about 120 nm to 180 nm) metal, particularly tungsten, for sufficient signal speed across the array.

In addition, the third hard mask line 60 has a thickness selected to be in a range between about 40 nm and 120 nm, for example about 80 nm.

In addition, the third liner material 64a has thickness selected be in a range between about 3 nm and 10 nm, for example 5 nm.

Figure 2J:
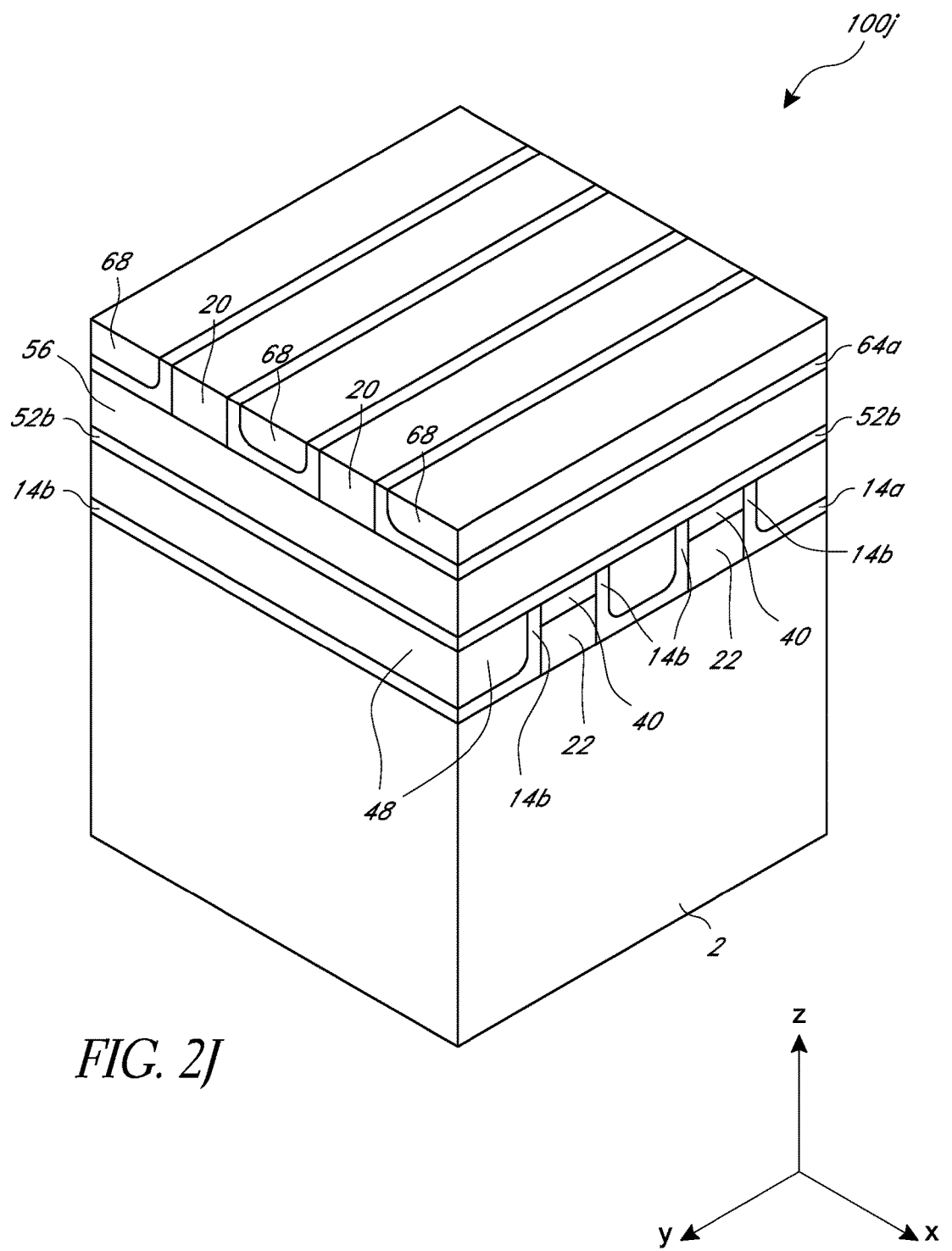

Referring to FIG. 2J, fabricating the third intermediate array structure 100j comprises filling spaces adjacent the second conductive line stacks, over the third conformal liner material 64a, according to one embodiment. The spaces are adjacent the second conductive line stack comprising the column line 20 and the third hard mask line 60 similar to FIG. 2H. The spaces are filled with a dielectric to form a third isolation dielectric layer 68. A suitable dielectric can include, for example, dielectric materials capable of filling spaces having relatively small space widths, similar to dielectric materials used to form the first isolation dielectric layer 48 in FIG. 2C.

Also similar to FIG. 2C, once the inter-line spaces are filled with the suitable isolation dielectric to form the third isolation dielectric layer 48, the third intermediate array structure 100j is chemical-mechanically polished (CMP) to remove excess isolation dielectric, the third hard mask line 60, and the third liner material 64a over the third hard mask line 60. The CMP process provides a substantially planarized surface comprising alternating lines of exposed column lines 20 and the third isolation dielectric layer 68, interposed by exposed lines 64b of the third liner material 64a.

The foregoing described fabrication method of an array structure according to some embodiments may form a single "deck" of phase change memory array. In one aspect, a deck can be defined as an array of memory cells electrically addressable by a single vertical stack including the row and column lines 22 and 20, respectively. However, some other embodiments can have multiple decks, where each additional deck is formed analogously as described herein (e.g., with reference to FIGS. 2A-2J). For example, a second deck can be fabricated on the third intermediate array structure 100j, where the second deck can be configured to share common column lines 20. For example, similar to FIG. 2C, a third electrode in the form of a line similar to the first electrode line 40 can be formed on top of the column lines 20. Subsequently, using a process sequence similar to that described above in connection with FIGS. 2D-2G, a second free standing pillar similar to the free-standing pillar 30c (FIG. 2F) can be formed on the column lines 20. After gap-filling and chemical-mechanical polishing similar to as described in FIG. 2G, a substantially planarized surface can be formed, which includes an exposed surface of a fourth electrode of a planarized pillar similar to the planarized pillar 30d (FIG. 2G) continuously surrounded by a dielectric material. Subsequently, using a process sequence similar to that described above in connection with FIGS. 2H-2J, a plurality of second row lines extending in the x-direction can be formed to electrically connect the second free standing pillar, thereby completing the formation of a second deck.

Figure 3:
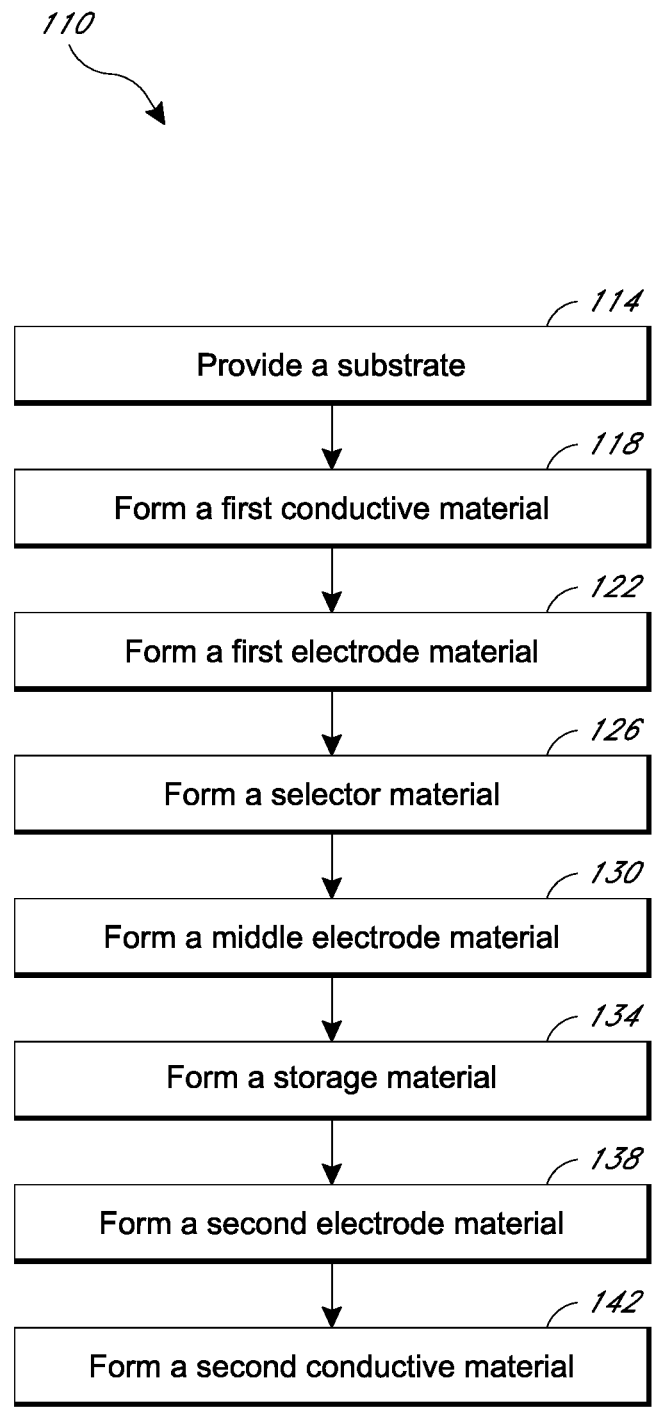
FIG. 3 is a flow chart illustrating a sequence of forming various materials to fabricate a cross-point memory array according to some embodiments.

In the embodiments described above with respect to FIGS. 2A-2J illustrate a particular sequence for a triple patterning process, other embodiments are possible. In this connection, FIG. 3 is a flow chart 110 illustrating a sequence of formation of various materials to fabricate a cross-point memory array according to some embodiments. Providing the various materials include providing 114 a substrate, forming 118 a first conductive material, forming 122 a first electrode material, forming 126 a selector material, forming 130 a middle electrode material, forming 134 a storage material, deposition 138 a top electrode material, and forming 142 a second conductive material. Processes for forming various materials in FIG. 3 can include depositing. Also in FIG. 3, processes for forming liners, resist and hard masks have been omitted for clarity, and none of the patterning processes are shown.

In the sequence illustrated in FIGS. 2A-2J, the first patterning process (FIG. 2A) to form the row line 22 is patterned after forming 122 the first electrode material. In other arrangements, however, the first patterning process to define row lines can be performed after forming 118 the first conductive material or after forming 126 the selector material. In such embodiments, the first electrode material can form part of the free-standing pillars rather than part of the row lines as shown in FIGS. 2A-2J.

In addition, in FIGS. 2A-2J, the second patterning process to define free standing pillars is performed after forming 138 the second electrode material. Alternative embodiments are possible. In other arrangements, for example, the second patterning process to define free standing pillars can be conducted after forming 134 the storage material and before forming the second electrode material. In such embodiments, the second electrode materials can be patterned in lines along with the second conductive material after forming 142 the second electrode material, rather than forming part of the free-standing materials as shown in FIGS. 2A-2J.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A memory device, comprising
a first conductive line extending in a first direction;
a first liner in contact with a sidewall of the first conductive line, wherein the first liner is in contact with a sidewall of another first conductive line extending parallel to the first conductive line, wherein the first liner covers a surface that extends between the first conductive line and the another first conductive line;
a first insulating material different from the first liner having a first sidewall and a second sidewall, the first sidewall and the second sidewall of the first insulating material in contact with the first liner;
a second conductive line extending in a second direction crossing the first direction;
a second liner in contact with a sidewall of the second conductive line and a sidewall of another second conductive line extending parallel to each other;
a pillar of a memory cell stack formed between and electrically connected to the first and second conductive lines, the pillar comprising:
a selector element disposed over the first conductive line,
a storage element disposed over the selector element;
a pillar liner continuously surrounding and in contact with a plurality of side surfaces of the pillar, the pillar liner in contact with the first liner and the first insulating material; and
a pillar insulating material different from the pillar liner, the pillar insulating material continuously surrounding and in contact with the pillar liner.

2. The memory device of claim 1, wherein the pillar insulating material is in contact with a plurality of side surfaces of the pillar liner.

3. The memory device of claim 1, wherein the selector element comprises a chalcogenide storage material.

4. The memory device of claim 1, wherein the storage element comprises a chalcogenide selector material.

5. The memory device of claim 4, wherein the chalcogenide selector material comprises arsenic.

6. The memory device of claim 1, wherein the pillar further comprises a middle electrode interposed between the selector element and the storage element, wherein the middle electrode comprises carbon.

7. The memory device of claim 1, wherein the pillar further comprises a second electrode interposed between the storage element and the second conductive line.

8. The memory device of claim 1, further comprising at least one of a first electrode line interposed between the first conductive line and the pillar and a second electrode line interposed between the second conductive line and the pillar.

9. The memory device of claim 8, wherein the pillar is formed on a surface comprising the first electrode line and adjacent spaces filled with an isolation dielectric, the adjacent spaces extending in the first direction.

10. The memory device of claim 9, wherein the pillar liner contacts portions of the first electrode line and portions of the isolation dielectric.

11. The memory device of claim 1, wherein the pillar liner is positioned between the first insulating material and the pillar insulating material.

12. The memory device of claim 1, wherein the second conductive line is in contact with a second electrode.

13. The memory device of claim 1, wherein the second liner covers a surface that extends between the second conductive line and the another second conductive line.

* * * * *